United States Patent
Ruehrig et al.

(10) Patent No.: US 7,309,617 B2
(45) Date of Patent: Dec. 18, 2007

(54) MRAM MEMORY CELL WITH A REFERENCE LAYER AND METHOD FOR FABRICATING

(75) Inventors: Manfred Ruehrig, Eckental (DE); Ulrich Klostermann, Fontainebleau (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/509,553

(22) PCT Filed: Mar. 11, 2003

(86) PCT No.: PCT/DE03/00775

§ 371 (c)(1),
(2), (4) Date: May 17, 2005

(87) PCT Pub. No.: WO03/083873

PCT Pub. Date: Oct. 9, 2003

(65) Prior Publication Data

US 2005/0208680 A1    Sep. 22, 2005

(30) Foreign Application Priority Data

Mar. 28, 2002 (DE) ............... 102 14 159

(51) Int. Cl.
*H01L 21/00* (2006.01)
(52) U.S. Cl. ............ 438/3; 438/795; 438/799; 257/295; 257/E27.104; 257/E29.272; 257/E21.208; 257/E21.663
(58) Field of Classification Search ............ 438/3, 438/795, 799; 257/295, E29.272, E21.208, 257/E21.663, E27.104
See application file for complete search history.

(56) References Cited

U.S. PATENT DOCUMENTS 5,686,838 A    11/1997    Van den Berg (Continued)

FOREIGN PATENT DOCUMENTS

| EP | 1 187 103 | 3/2002 |
|---|---|---|
| JP | 2001184631 | 7/2001 |
| WO | WO 99/57682 | 11/1999 |
| WO | WO 00/02006 | 1/2000 |

OTHER PUBLICATIONS

Sun, N.X.; Wang, S.X., "Soft high saturation magnetization Fe-Co-N thin films for inductive write heads," Magnetics Conference, 2000. INTERMAG 2000 Digest of Technical Papers. 2000 IEEE International , vol. no.pp. 191-191, Apr. 4-8, 2005.*

*Primary Examiner*—Michelle Estrada
*Assistant Examiner*—Jarrett J Stark
(74) *Attorney, Agent, or Firm*—Dicke, Billig & Czaha, PLLC

(57) ABSTRACT

The invention relates to a method for fabricating a reference layer for MRAM memory cells and an MRAM memory cell equipped with a reference layer of this type. A reference layer of this type comprises two magnetically coupled layers having a different Curie temperature. When cooling from a temperature above the Curie temperature $T_C^1$ of the first layer in an external magnetic field, the magnetization of the second layer is oriented by a second-order phase transition along the field direction of the external magnetic field. Upon further cooling below the Curie temperature $T_C^2$ of the second layer, the latter is oriented antiparallel with respect to the first layer as a result of the antiferromagnetic coupling between the two layers.

7 Claims, 2 Drawing Sheets

U.S. PATENT DOCUMENTS

| | | | | |
|---|---|---|---|---|
| 6,052,263 | A * | 4/2000 | Gill | 360/324.11 |
| 6,088,195 | A * | 7/2000 | Kamiguchi et al. | 360/324.12 |
| 6,097,058 | A * | 8/2000 | Nakamura et al. | 257/316 |
| 6,172,904 | B1 * | 1/2001 | Anthony et al. | 365/173 |
| 6,233,171 | B1 * | 5/2001 | Youm et al. | 365/158 |
| 6,704,220 | B2 * | 3/2004 | Leuschner | 365/173 |
| 6,818,458 | B1 * | 11/2004 | Gill | 438/3 |
| 6,914,806 | B2 * | 7/2005 | Kunikiyo | 365/158 |
| 7,230,804 | B2 * | 6/2007 | Gill | 360/324.2 |
| 2003/0206434 | A1 * | 11/2003 | Leuschner | 365/173 |
| 2004/0152218 | A1 * | 8/2004 | Deak | 438/3 |
| 2004/0216998 | A1 * | 11/2004 | Fu | 204/298.11 |
| 2004/0218314 | A1 * | 11/2004 | Gill | 360/324.2 |
| 2006/0094129 | A1 * | 5/2006 | Pinarbasi | 438/3 |

* cited by examiner

MRAM MEMORY CELL WITH A REFERENCE LAYER AND METHOD FOR FABRICATING

CROSS REFERENCE TO RELATED APPLICATIONS

This Utility Patent Application claims the benefit of the filing date of German Application No. DE 102 14 159.2, filed Mar. 28, 2002, and International Application No. PCT/DE03/00775, filed Mar. 11, 2003, both of which are herein incorporated by reference.

BACKGROUND

The invention relates to a method for fabricating a reference layer for MRAM memory cells and to an MRAM memory cell having a reference layer fabricated in this way.

As is known, an MRAM arrangement is based on ferromagnetic storage with the aid of the TMR effect (TMR=tunneling magnetoresistance). The accompanying FIG. 1 illustrates a diagrammatic cross section through a known MRAM memory cell that utilizes said TMR effect. The TMR memory cell, comprising a layer stack having a soft-magnetic layer 2, a tunnel oxide layer 3 and a hard-magnetic or reference layer, lies between a bit line 5 and a word line 4, which cross one another. The magnetization direction (arrow) of the hard-magnetic layer 1 is predetermined, while the magnetization direction (double arrow) of the soft-magnetic layer 2 is adjustable by sending corresponding currents I, I' in different directions through the word line 4 and the bit line 5. These currents enable the magnetization of the soft-magnetic layer 2 to be polarized parallel or antiparallel with respect to the magnetization direction of the hard-magnetic layer 1. The resistance of the layer stack is lower in the case of parallel magnetization of the two layers 1 and 2 than in the case of antiparallel magnetization, which can be evaluated as state "0" and "1", or vice versa.

Since the net magnetization of the reference layer determines the overall behavior of the MRAM memory cell, it is desirable to make said net magnetization adjustable in a targeted manner during the fabrication of MRAM memory cells.

SUMMARY

One embodiment of the invention specifies a method for fabricating a reference layer for MRAM memory cells and an MRAM memory cell equipped with a reference layer fabricated in this way, such that the net magnetization of the reference layer and thus the overall behavior of the MRAM memory cell can be established in a targeted manner.

A method for fabricating a reference layer for MRAM memory cells according to one embodiment of the invention, comprises:

(A) a layer system is provided for the reference layer, which layer system has a first layer of a material having a first Curie temperature $T_C^1$, which first layer can be permanently magnetized by an external magnetic field, and a second layer of a material having a second Curie temperature $T_C^2$, which is significantly lower than the first Curie temperature $T_C^1$, which second layer can be magnetized by antiferromagnetic coupling with the first layer;

(B) an external magnetic field is generated;

(C) the layer system is cooled from a temperature above the first Curie temperature $T_C^1$ to below the first Curie temperature $T_C^1$ by action of the external magnetic field, the field strength of the external magnetic field being greater than the saturation field strength of the first layer, so that the magnetization of the first layer is oriented by a second-order phase transition along the field direction of the external magnetic field; and (D) the layer system is subsequently cooled below the second Curie temperature $T_C^2$, the magnetization of the second layer being oriented antiparallel with respect to the magnetization of the first layer on account of antiferromagnetic coupling between the first and second layers.

Accordingly, a, for example symmetrical, artificial antiferromagnet (AAF) is proposed for the reference layer, said antiferromagnet having the two antiferromagnetically coupled layers that differ in their Curie temperature. When cooling from a temperature above the first Curie temperature $T_C^1$ in an externally applied magnetic field, the magnetization of the first layer of the layer system is oriented by a second-order phase transition along the field direction of the external magnetic field provided that the external field strength is greater than the saturation field strength for the first layer. Upon further cooling to below the second Curie temperature $T_C^2$, the magnetization of the second layer is oriented antiparallel with respect to the magnetization direction of the first layer as a result of the antiferromagnetic coupling between the two layers. As a result, the two layers, that is to say the first layer and the second layer, form an artificial antiferromagnet (AAF).

The second-order phase transition at the lower Curie temperature $T_C^2$ of the second layer generates magnetization distribution in the second layer. The magnetization distribution present in the first layer is transferred to the second layer by the existing coupling (antiparallel) by antiferromagnetic coupling.

If the net magnetizations (saturation flux=saturation magnetization×layer cross section) of the first and second layers are in each case chosen correspondingly, it is possible to set a net magnetization of the layer system of zero, that is to say that the magnetization within the artificial antiferromagnet thus produced should therefore be largely stable with respect to external fields as long as the magnetic coupling between the individual layers is strong enough.

Furthermore, the net magnetization of the layer system can also be set controllably in a targeted manner, for example by choosing the saturation magnetization or the layer cross section of the second layer to be smaller than that of the first layer. Consequently, in the event of dispensing with the advantage of a symmetrical artificial antiferromagnet in the case of which the two layers have identical saturation flux, it is possible to use the proposed layer construction for fabricating an inverse artificial antiferromagnet. In the TMR memory cell, the thinner layer is then in contact with the tunnel barrier. The problem that exists with the customary construction, where residual 360° walls attenuate the signal, is obviated since each layer is inherently saturated and therefore has no 360° walls.

A homogeneous magnetization of the first layer that is obtained in step (C) can also be transferred to the second layer by intermediate layer coupling. That is to say that in step (A), a layer system is provided which has a very thin intermediate coupling layer between the first and second layers. Thus, no 360° walls occur in the second layer when the first layer is saturated.

The following material combinations are exemplary for the first layer and the second layer of various embodiments of the proposed layer system:

(a) First layer: $(Co,Fe,Mn)_{80}(Si,B)_{20}$ having the Curie temperature $T_C^1=485°$ C. and second layer: $(Co,Fe,Mo)_{73}(Si,B)_{27}$ having the Curie temperature $T_C^2=210°$ C. A soft/soft magnetization behavior is achieved overall with this material combination.

(b) First layer: $(Co,Fe)_{83}(Si,B)_{17}$ having the Curie temperature $T_C^1=415°$ C. and second layer: $(Ni,Fe)_{78}(Si,B,C)_{22}$ having the Curie temperature $T_C^2=260°$ C. This material combination enables a magnetostrictive behavior of the layer system.

(c) First layer: $Tb_{20}Fe_{40}Co_{40}$ having the Curie temperature $T_C^1=400°$ C. and second layer: $Tb_{20}Fe_{80}$ having the Curie temperature $T_C^2=150°$ C. This enables a ferrimagnetic behavior of the layer system.

Materials of the intermediate layer may be ruthenium, copper or gold.

The magnetic coupling between the first layer and the second layer depends on the thickness of the intermediate layer, which must be chosen such that the antiferromagnetic coupling takes place.

In one embodiment, a reference layer fabricated by this method and an MRAM memory cell equipped with a reference layer of this type have a targeted setting of the magnetization distribution in the individual layers. In one embodiment, vanishing net magnetization or a net magnetization of the layer system can be controlled through choice of the saturation magnetization and the thickness of the first and second layers. In one embodiment, when the first layer is frozen, the magnetization of the second layer is not active (above $T_C^2$). In one embodiment, transfer of the homogeneous magnetization from the first layer to the second layer is accomplished by the intermediate layer coupling mentioned. Thus, no 360° walls should occur in the second layer when the first layer is saturated. In an embodiment, dispensing with the symmetrical artificial antiferromagnet in the case of which the two layers have an identical saturation flux, it is possible to use the proposed layer construction for fabricating an inverse artificial antiferromagnet. The problem that exists with the customary construction of an MRAM memory cell where residual 360° walls attenuate the signal is obviated since each layer is inherently saturated and therefore has no 360° walls.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
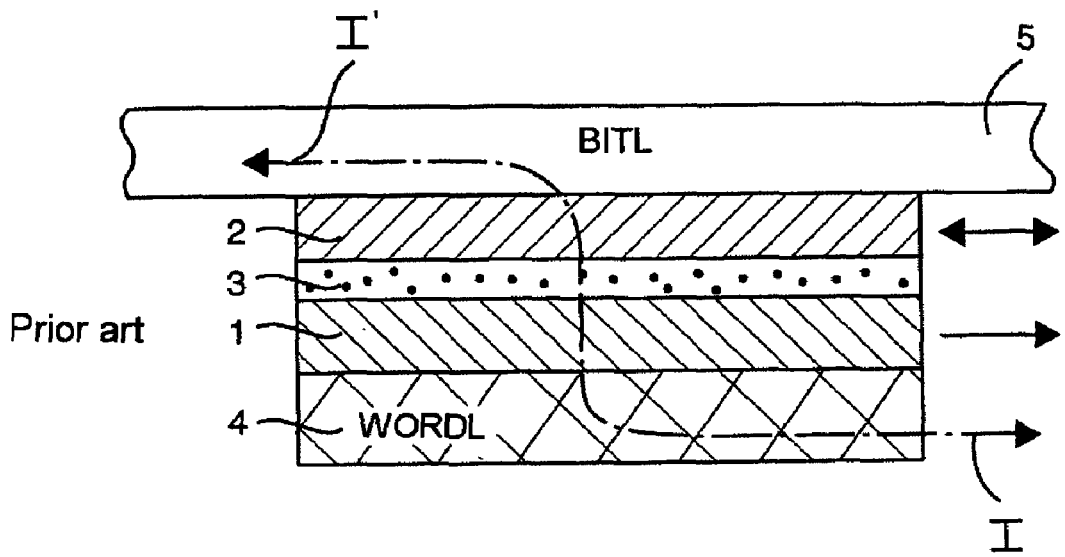
FIG. 1 illustrates a diagrammatic cross section through the known structure of an MRAM memory cell.
Figure 2:
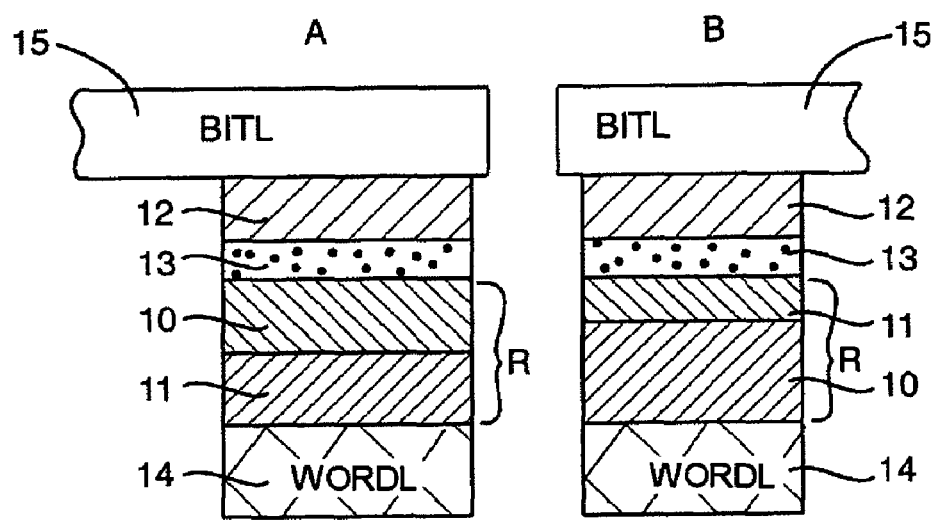
FIGS. 2A and 2B illustrate diagrammatic cross sections through a first and a second exemplary embodiment of an MRAM memory cell having a reference layer fabricated according to the invention.

In the case of the MRAM memory cells according to embodiments of the invention that are illustrated diagrammatically in FIGS. 2A and 2B, a layer stack comprising two layers 10 and 11, which form a reference layer system R according to the invention, a tunnel barrier 13 and a soft-magnetic layer 12 lies between a word line (WORDL) 14 and a bit line (BITL) 15. In FIG. 2A, the first layer 10 and the second layer 11 of the layer system R in each case have the same saturation magnetization and the same layer cross section, so that a net magnetization of the layer system R results as zero.

By contrast, in FIG. 2B, the first layer 10 and the second layer 11 of the layer system R of the reference layer have a different net magnetization by virtue of the layer cross section of the second layer 11 being chosen to be smaller than that of the first layer 10. The thinner second layer 11 is in contact with the tunnel barrier 13. Since each layer, that is to say the first layer 10 and the second layer 11, are inherently saturated and therefore have no 360° walls, the problem that exists with the known construction of an MRAM memory cell where residual 360° walls attenuate the signal is obviated.

Figure 3:
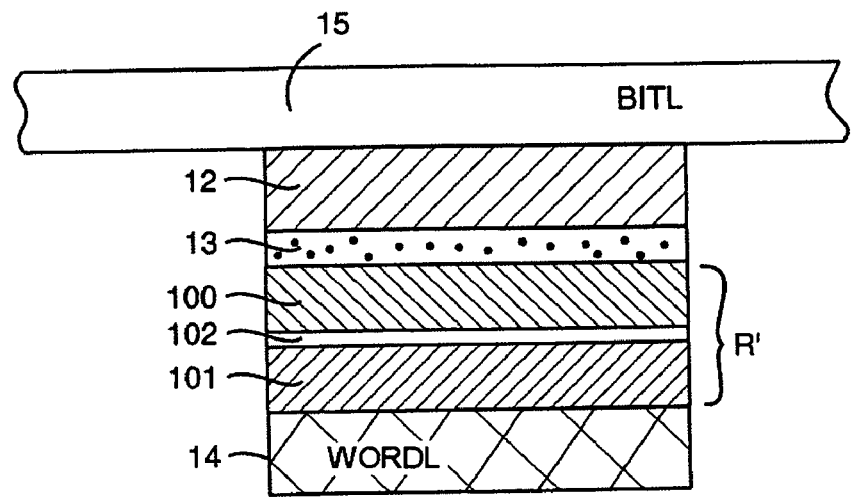
FIG. 3 illustrates a diagrammatic cross section through a third exemplary embodiment of a further MRAM memory cell equipped with another reference layer according to the invention.

In the case of the third exemplary embodiment illustrated in the form of a diagrammatic cross section in FIG. 3, the layer system R' of the reference layer has a construction comprising a first layer 100, a thin intermediate coupling layer 102 and a second layer 101. By virtue of said intermediate coupling layer 102, the homogeneous magnetization of the first layer 100 is transferred to the second layer 101 through the coupling of the intermediate coupling layer 102. As a result, no 360° walls occur in the second layer when the first layer is saturated. For the rest, the structure that is illustrated diagrammatically in FIG. 3 and corresponds to the third exemplary embodiment of an MRAM memory cell according to the invention has the same construction as the first exemplary embodiment illustrated in FIG. 2A.

Figure 4:
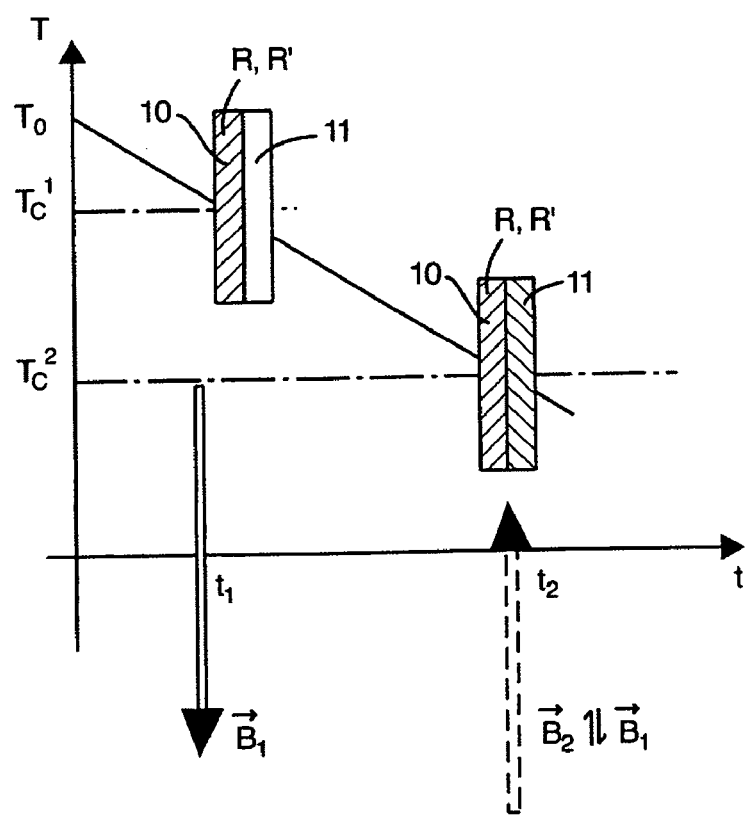
FIG. 4 diagrammatically illustrates a diagram for elucidating the method according to one embodiment of the invention for fabricating the reference layer.

FIG. 4 diagrammatically illustrates the method according to one embodiment of the invention for fabricating a reference layer for MRAM memory cells.

A layer system is provided for the reference layer R or R', which layer system has a first layer of a material having a first Curie temperature $T_C^1$, which first layer can be magnetized by an external magnetic field, and a second layer of a material having a second Curie temperature $T_C^2$, which is significantly lower than the first Curie temperature $T_C^1$, which second layer can be magnetized by antiferromagnetic coupling with the first layer. The temperature axis T shows these two Curie temperatures $T_C^1$ and $T_C^2$. At the instant t1, the layer system R, R' is cooled from a temperature T0 above the first Curie temperature $T_C^1$ to below the first Curie temperature $T_C^1$, said layer system R, R' being situated in an external magnetic field B1 (arrow). In this case, the magnetization of the first layer 10 is oriented by a second-order phase transition along the field direction of the external magnetic field B1. This presupposes that the field strength of B1 is greater than the saturation field strength of the first layer 10.

Upon further cooling, the magnetic field B1 may be switched off, and as soon as the temperature T falls below the Curie temperature $T_C^2$ of the second layer 11, at the instant t2, the magnetization of the second layer 11 is oriented antiparallel with respect to the first layer 10 as a result of the antiferromagnetic coupling between the two layers. This forms the artificial antiferromagnet AAF. As mentioned, and described with reference to FIG. 3, the antiferromagnetic coupling of the first layer to the second layer may also be imparted by the provision of an intermediate coupling layer.

As illustrated by a dashed arrow at the instant t2 in FIG. 4, for the purpose of homogenizing the magnetization distribution in the second layer 11, when passing through $T_C^2$, it is additionally possible to apply a magnetic field B2 whose field direction is opposite to the magnetization of the first layer 10 as long as this does not suffice to reverse the magnetization impressed in the first layer 10. This necessitates a sufficent coercitive field strength of the first layer or a sufficiently "rectangular" switching behavior of the first layer 10. In order to achieve this, the stability of the magnetization of the first layer 10 may be stabilized by means of a coupling to a natural antiferromagnet whose Neel temperature lies above the second, lower Curie temperature $T_C^2$.

Possible layer combinations for the first layer and the second layer may be

| First layer 10 (100) | $T_C^1$ | Second layer 11 (101) | $T_C^2$ | Special feature |
|---|---|---|---|---|
| $(Co,Fe,Mn)_{80}(Si,B)_{20}$ | 485° C. | $(Co,Fe,Mo)_{73}(Si,B)_{27}$ | 210° C. | (soft/soft) |
| $(Co,Fe)_{83}(Si,B)_{17}$ | 415° C. | $(Ni,Fe)_{78}(Si,B,C)_{22}$ | 260° C. | (magnetostrictive) |
| $Tb_{20}Fe_{40}Co_{40}$ | 400° C. | $Tb_{20}Fe_{80}$ | 150° C. | (ferrimagnetic) |

The above-mentioned intermediate layer 102 illustrated in FIG. 3 may comprise ruthenium, copper, gold.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, a release handle has been illustrated as causing the actuator to slide up the ramp of the transceiver module, but one skilled in the art will recognize that other mechanisms can be used to slide the actuator up the ramp in order to release the transceiver module from the case. This application is intended to cover any adaptations or variations of the specific embodiments discussed herein. Therefore, it is intended that this invention be limited only by the claims and the equivalents thereof.

What is claimed is:

1. A method for fabricating a reference layer for MRAM memory cells, comprising:
    providing a layer system for the reference layer, the layer system exclusively consisting of:
        a first layer of a material having a first Curie temperature, wherein the first layer has a saturation field strength and can be permanently magnetized by an external magnetic field;
        a second magnetic layer of a material having a second Curie temperature which is significantly lower than the first Curie temperature, wherein the second layer can be magnetized by antiferromagnetic coupling with only the first layer; and
        a very thin intermediate coupling layer between the first and second layers;
    forming an artificial antiferromagnet exlusively from the first layer, the second layer and the intermediate coupling layer by the steps of:
        generating an external magnetic field having a field strength;
        cooling the layer system from a temperature above the first Curie temperature to below the first Curie temperature by action of the external magnetic field, the field strength of the external magnetic field being greater than the saturation field strength of the first layer, so that magnetization of the first layer is oriented by a second-order phase transition along the field direction of the external magnetic field; and
        subsequently cooling the layer system below the second Curie temperature, magnetization of the second layer being oriented antiparallel with respect to the magnetization of the first layer on account of antiferromagnetic coupling between the first and second layers, said antiferromagnetic coupling being imparted by the intermediate coupling layer.

2. The fabrication method of claim 1, further including setting the net magnetization of the layer system through the choice of a saturation flux, in particular of the layer cross section in each case of the first and second layers.

3. The fabrication method of claim 1, further including setting the net magnetization of the layer system to zero by the respectively identical net magnetization of the first layer and the second layer.

4. The fabrication of claim 1, further including setting the net magnetization of the layer system to be not equal to zero through selection of the second layer such that the layer cross section thereof is smaller than that of the first layer.

5. The fabrication of claim 1, wherein subsequently cooling the layer system below the second Curie temperature further includes applying an external magnetic field, whose field direction is opposite to the magnetization direction of the first layer, upon passing through the second Curie temperature.

6. The fabrication method of claim 1, wherein the material of the first layer is chosen from a group comprising $(Co,Fe,Mn)_{80}(Si,B)_{20}$; $(Co,Fe)_{83}(Si,B)_{17}$; and $Tb_{20}Fe_{40}Co_{40}$, and the material of the second layer is chosen from the group comprising $(Co,Fe,Mo)_{73}(Si,B)_{27}$; $(Ni,Fe)_{78}(Si,B,C)_{22}$; and $Tb_{20}Fe_{80}$.

7. The fabrication method of claim 1, wherein the material of the intermediate coupling layer is chosen from the group comprising ruthenium, copper, and gold.

* * * * *